United States Patent
Fair (10) Patent No.: US 6,849,122 B1
(45) Date of Patent: *Feb. 1, 2005

(54) THIN LAYER METAL CHEMICAL VAPOR DEPOSITION

(75) Inventor: James A. Fair, Mountain View, CA (US)

(73) Assignee: Novellus Systems, Inc., San Jose, CA (US)

(*) Notice: Subject to any disclaimer, the term of this patent is extended or adjusted under 35 U.S.C. 154(b) by 214 days.

This patent is subject to a terminal disclaimer.

(21) Appl. No.: 10/094,308

(22) Filed: Mar. 7, 2002

Related U.S. Application Data (63) Continuation-in-part of application No. 09/766,143, filed on Jan. 19, 2001.

(51) Int. Cl.[7] .............................................. C30B 23/02
(52) U.S. Cl. ........................ 117/89; 117/102; 117/104; 117/957
(58) Field of Search ........................... 117/89, 104, 102, 117/937

(56) References Cited

U.S. PATENT DOCUMENTS

| | | |
|---|---|---|
| 5,916,365 A | 6/1999 | Sherman |
| 6,203,613 B1 | 3/2001 | Gates et al. |
| 6,464,779 B1 * | 10/2002 | Powell et al. ................. 117/89 |

OTHER PUBLICATIONS

Per Martensson and Jan–Otto Carlsson, "Atomic Layer Epitaxy of Copper on Tantalum", Chem. Vapo. Deposition 1997, vol. 3, No. 1, pp. 45–50.

S. M. George, A. W. Ott, and J.W. Klaus, "Surface Chemistry for Atomic Layer Growth", J. Phys. Chem, 1996, 100, 13121–13131.

Shin Yokoyama, Hiroshi Goto, Takahiro Miyamoto, Norihiko Ikeda, and Kentaro Shibahara, "Atomic Layer Controlled Deposition of Silicon Nitride and in Situ Growth Observation By Infrared Reflection Absorption Spectroscopy", Applied Surface Science, 112 (1997) 75–81.

Kaupo Kukli, Mikko Ritala, and Markku Leskela, "Atomic Layer Epitaxy Growth of Tantalum Oxide Thin Films from $Ta(OC_2H_5)_5$ and $H_2O$, J", Electrochem. Soc., vol. 142, No. 5, May 1995, 1670–1675.

Utriainen et al., "Studies of Metallic Thin Film Growth in an Atomica Layer Epitaxy Reactor Using M9acac)2 M=Ni, Cu, Pt Precursors", Applied Surface Sciences vol. 157, (2000), pp. 151–158.

* cited by examiner

*Primary Examiner*—Robert Kunemund
(74) *Attorney, Agent, or Firm*—Beyer Weaver & Thomas, LLP (57) ABSTRACT

A CVD method deposits conformal metal layers on small features of a substrate surface. The method includes three principal operations: depositing a thin conformal layer of precursor over some or all of the substrate surface; oxidizing the precursor to convert it to a conformal layer of metal oxide; and reducing some or all of the metal oxide to convert it to a conformal layer of the metal itself. The conformal layer of precursor may form a "monolayer" on the substrate surface. Examples of metals for deposition include copper, cobalt, ruthenium, indium, and rhodium.

26 Claims, 6 Drawing Sheets

| Cu(hfac)L, L= | State (at room T) | Vapor Pressure (60°C) | Stability | $E_a$ (kcal/mol) for ligand (L) dissociation[68] |
|---|---|---|---|---|
| Trimethylphosphine (PMe$_3$) | solid | 0.080 Torr | air sensitive | 28.0 |
| 1,5-Cyclo Octadiene (1,5-COD) | solid | 0.055 Torr | air stable | 14.2 |
| Trimethylvinylsilane (tmvs) | liquid | 1.3 Torr | air sensitive | 12.0 |
| (2-butyne) | solid | | air sensitive | 8.5 |

THIN LAYER METAL CHEMICAL VAPOR DEPOSITION

CROSS-REFERENCE TO RELATED APPLICATIONS

This application is a continuation-in-part, claiming priority under 35 U.S.C. § 120, from U.S. patent application Ser. No. 09/766,143, filed Jan. 19, 2001 by Powell and Fair, and titled "Copper Atomic Layer Chemical Vapor Deposition." That application is incorporated herein by reference for all purposes.

FIELD OF THE INVENTION

This invention pertains to systems and methods and apparatus for metal deposition. More specifically, the invention pertains to methods that deposit a thin layer of metal precursor, then oxidize the precursor to form an oxide, and finally reduce the oxide to the metal itself.

BACKGROUND OF THE INVENTION

Integrated circuit (IC) manufacturers have traditionally used aluminum and aluminum alloys, among other metals, as the conductive metal for integrated circuits. While copper has a greater conductivity than aluminum, it has not been used because of certain challenges it presents, including the fact that it readily diffuses into silicon oxide and degrades insulating electrical properties even at very low concentrations. Recently, however, IC manufacturers have nevertheless turned to copper. Most notable among the IC metalization processes that use copper is Damascene processing.

Damascene processing is a method for forming metal lines on integrated circuits. It involves formation of inlaid metal lines in trenches and vias formed in a dielectric layer (inter-metal dielectric). A barrier layer that blocks diffusion of copper atoms is formed over the dielectric layer topology. Damascene processing is often a preferred method because it requires fewer processing steps than other methods and offers a higher yield. It is also particularly well-suited to metals such as copper that cannot readily be patterned by plasma etching.

In a typical copper IC fabrication process, the formation of the desired conductive wires on the chip begins with seed layer deposition, usually by physical vapor deposition (PVD). The seed layer provides a conformal, conductive layer on which a thicker layer of copper is electrofilled in order to fill in the features (e.g., trenches and vias) of the semiconductor wafer.

PVD has traditionally been used to form the seed layer, but does not always provide conformal step coverage, particularly with surface features having high aspect ratios (greater than about 5:1). Coverage that is not conformal is uneven; i.e., thicker in some places than others, and that may include actual gaps where the metal is discontinuous. Modern integrated circuit manufacturing has moved toward features with high-aspect ratios, particularly in advanced integrated circuits where copper is used as the conductive metal, e.g., Damascene processing. For instance, a typical via may have a diameter of 0.07 $\mu$m (the width of 266 copper atoms) but have a depth of 0.4 $\mu$m, which gives an aspect ratio of 5.7:1.

Chemical vapor deposition (CVD) is another process by which the seed layer can be deposited. However, poor nucleation of the copper at the barrier layer is a common problem with CVD, as is agglomeration. These problems result, in part, because copper itself does not adhere well to most materials. This includes titanium nitride and other materials conventionally employed as diffusion barriers. Further, the relatively high temperatures [>150° C.] required by CVD techniques of the current art aggravates the problem. Both poor nucleation and agglomeration can result in non-conformal deposition. Also, the high substrate temperature consumes a significant fraction of the thermal budget allowed for IC manufacture.

Another problem with metal deposition CVD processes arises from their carbon-containing or fluorine-containing precursor compounds, which can cause interface contamination, thus further deteriorating the adhesion of the metal layer to the underlying barrier layer. The precursor decomposition products such as carbon, organic compounds, and fluorinated compounds can become trapped in the deposited metal layer. This can lead to reliability problems where subsequent stress-inducing steps such as chemical mechanical polishing (CMP) are carried out.

Note that many of the above problems are not limited to copper seed layers. They extend to other metals and other IC fabrication process steps.

SUMMARY OF THE INVENTION

The present invention provides improved methods and apparatus for depositing conformal metal layers on small features of a substrate surface. The methods include three principal operations: depositing a thin conformal layer of precursor over some or all of the substrate surface; oxidizing the precursor to convert it to a conformal layer of metal oxide; and reducing some or all of the metal oxide to convert it to a conformal layer of the metal itself. In a particularly preferred embodiment, the conformal layer of precursor forms a "monolayer" on the substrate surface. Preferred metals for deposition include copper, cobalt, ruthenium, indium, and rhodium.

One aspect of the invention provides methods of forming a metal layer on a workpiece, frequently a partially fabricated integrated circuit having one or more gaps. The methods may be characterized by the following sequence: (a) depositing a layer of organo-metallic precursor on a surface of the partially fabricated integrated circuit; (b) oxidizing the organo-metallic precursor to form a metal oxide layer on the surface; and (c) reducing at least a portion of the metal oxide layer to form the metal layer on the partially fabricated integrated circuit. Preferably, the metal of the metal layer is copper, cobalt, ruthenium, rhodium, indium, or a combination thereof. The organo-metallic precursor comprises any suitable source of that metal that can be deposited and easily converted to an oxide of the metal. For example, the organo-metallic precursor may be an organo-copper compound, an organo-cobalt compound, an organo-ruthenium compound, an organo-iridium compound, an organo-rhodium compound, or a combination thereof.

The methods have various important applications in the IC fabrication arts. Examples include forming seed layers for subsequent electrodeposition, forming adhesion layers for binding subsequently deposited metal layers to underlying dielectric layers, etc. Depending upon the application, the deposition operation (a) is performed on different chemically distinct substrate surfaces. For example, the substrate may have an exposed layer of diffusion barrier, an exposed adhesion layer, or an exposed dielectric layer, etc.

The invention conformally deposits metal layers on high aspect ratio gaps. Such gaps have an aspect ratio of at least about 5:1. For many applications, the gaps have a small principal dimension (diameter for cylindrical vias, width for trenches, etc.). The method will conformally cover gaps having principal dimensions of at most about 0.26 µm.

In one important application, the method deposits a seed layer suitable for subsequent electro-deposition of a bulk layer of metal on the partially fabricated integrated circuit. Electro-deposition can effectively fill the gaps with the metal (e.g. copper). In certain commercially important embodiments, the bulk layer of metal forms conductive lines on the integrated circuit.

In other embodiments, the metal layer serves as a base for depositing a second metal layer. The underlying metal layer helps the second metal layer to adhere to the surface of the partially fabricated integrated circuit. For example a cobalt layer formed by this invention may serve as an adhesion layer for a subsequently deposited copper seed layer or other layer. Copper in particular does not adhere well to titanium nitride or other diffusion barrier layer materials commonly employed in Damascene processing. So certain embodiments form a layer of cobalt as outlined above on a layer of diffusion barrier. Then, a copper seed layer is deposited by PVD or other appropriate deposition process, including ALCVD in accordance with this invention. Thereafter, the process electro-deposits a bulk layer of copper on the substrate to thereby fill gaps on the substrate surface with copper.

If the invention forms cobalt metal layers, suitable organo-cobalt precursor molecules include cobalt carbonyl ($Co_2(CO)_6$), cobaltocene ($Co(C_5H_5)_2$), cyclopentadienyl cobalt dicarbonyl ($C_5H_5Co(CO)_2$), cobalt acetylacetonate ($Co(C_5H_7O_2)_3$), cobalt tricarbonyl nitrosyl ($Co(CO)_3NO$), and combinations thereof.

The deposition operation (a) may generally involve absorbing a layer of the organo-metallic precursor the surface of the partially fabricated integrated circuit. In certain preferred embodiments, it involves forming a saturated layer of the organo-metallic precursor on the surface of the partially fabricated integrated circuit—by ALCVD for instance. In a specific embodiment, the saturated layer is a monolayer of organo-metallic precursor.

The oxidation operation (b) may comprise oxidizing the organo-metallic precursor layer with an oxygen plasma or an oxygen-containing plasma And the reduction operation (c) may comprise reducing the metal oxide layer with a hydrogen plasma or a hydrogen-containing plasma.

Another aspect of the invention pertains to systems and methods for atomic layer chemical vapor deposition (ALCVD). One important application pertains to methods for atomic layer vapor deposition of copper, particularly to form seed layers for integrated circuit fabrication, as well as apparatus modules for performing such deposition. Copper ALCVD provides a method by which highly conformal copper layers of a single atom thickness can be applied to the substrate. Copper ALCVD thus effectively engineers the copper seed layer on an atomic level.

In one embodiment, a method for atomic layer depositing of a metal includes the following: exposing a substrate surface to a metal precursor in order to deposit an atomic layer of the precursor, exposing the atomic layer of the precursor to an oxidizing agent, thus leaving behind an atomic layer of oxidized metal, and exposing the oxidized metal to a reducing agent, thus reducing the oxidized metal to metal and leaving an atomic layer of the metal. The method can be repeated to form more than one atomic layer. The method can be used to deposit part or all of a seed layer in an integrated circuit manufacturing process, for example, Damascene processing.

Another embodiment of the invention provides for a method for atomic layer deposition of a metal, including (a) exposing a substrate surface to a metal precursor in order to deposit an atomic layer of the precursor, and (b) exposing the atomic layer of the precursor to an oxidizing agent, thus leaving behind an atomic layer of the metal. In this embodiment, precursor and reaction conditions are chosen so that the oxidation reaction liberates the free metal, rather than generating an oxide of the metal. Hence a separate reduction step is not required for this embodiment. As before, the metal to be deposited can be copper. The method can be repeated to form more than one atomic layer. The method can be used to deposit part or all of a seed layer in an integrated circuit manufacturing process, for example, Damascene processing.

Another aspect of the invention provides for an apparatus module for performing atomic layer chemical vapor deposition, the module including a source of organo-metal precursor to metal, a source of oxidizing agent capable of converting the precursor to metal oxide, a source of reducing agent capable of reducing the metal oxide back to elemental metal and a substrate support heated to a temperature at which a saturated layer (e.g., a monolayer) of precursor adheres to the substrate. The apparatus can also include a semiconductor wafer. The copper can be the metal, and the apparatus can be used to form part or all of a seed layer for integrated circuit manufacturing.

Another aspect of the invention provides for an apparatus module for performing atomic layer chemical vapor deposition, the module including a source of organo-metal precursor to metal, a source of oxidizing agent capable of converting the precursor to metal, and a substrate support heated to a temperature at which a saturated layer of precursor adheres to the substrate. The apparatus can also include a semiconductor wafer. The copper can be metal, and the apparatus can be used to form part or all of a seed layer for integrated circuit manufacturing.

These above methods and apparatus are particularly useful in conformally coating features (e.g., trenches, vias and lines) having small dimensions (e.g., at most about 0.25 µm) and/or high aspect ratios (e.g. at least about 5:1).

These and other features and advantages of the present invention will be described in more detail below with reference to the associated drawings.

DETAILED DESCRIPTION OF THE PREFERRED EMBODIMENTS

Introduction

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As used herein, the term "metal layer" refers to a thin conformal or reasonably conformal film of metal residing on a substrate surface. As indicated, the methods of this invention produce "metal layers." In many embodiments of this invention, the metal layer is formed via one or more cycles of (i) precursor deposition, (ii) precursor oxidation, and (iii) oxide reduction. During each cycle, the deposited metal layer is very thin, on the order of 1 to 50 atomic layers.

In some cases, the metal layer formed during each cycle is a "monolayer" in thickness. In such cases, if only a single deposition cycle is performed, the total thickness of the metal layer is only a monolayer.

As used herein, the term monolayer refers to a quantity of metal atoms (or other chemical entity such as a precursor compound) that fills available sites on a surface. The number of atoms or molecules per unit of surface area is a function of numerous factors such as the physico-chemical properties of available sites, steric features of the atoms/molecules (that might exclude atoms/molecules from adjacent sites), and orientation of atoms/molecules adhered to the surface.

Monolayers are essentially a single layer (or slightly more than a single layer) of atoms or chemical molecules on a surface. As explained below, such monolayers are thermodynamically distinct from atoms or chemical compounds existing in a bulk state.

Examples of metals useful in metal layers of this invention include copper, cobalt, ruthenium, iridium, and rhodium. The invention is not limited to these metals. Essentially any metal of interest having the following features will work with the invention: (i) an organo-metallic precursor that is stable at the temperature where it adsorbs to the substrate surface and (ii) a relatively unstable oxide that can be easily reduced to the metal itself.

A "substrate" is any solid or liquid material on which a metal layer is to be formed in accordance with this invention. The substrate may be homogeneous or heterogeneous chemically or structurally over a scale of nanometers to micrometers. The invention is particularly valuable when the substrate has various gaps or recesses on its surface. Small gaps on the order of a micron or hundred nanometers are particularly difficult to conformally cover by conventional deposition techniques. The present invention is particularly good at conformal deposition of metal within such features. It even works with high aspect ratio features having aspect ratios of 5:1 or greater.

One commercially important application of the present invention involves deposition of thin metal layers on a semiconductor substrate such as a partially fabricated integrate circuit—typically provided as one of many such integrated circuits on a semiconductor wafer (e.g., a single crystal silicon wafer). Commonly, the semiconductor substrates for use with this invention possess a particular exposed material on which the metal layer is to be deposited. Frequently encountered examples of these exposed materials include diffusion barrier layers, adhesion layers, dielectric layers, etc.

A "semiconductor wafer" as discussed in this document is a semiconductor substrate at any of the various states of manufacture/fabrication in the production of integrated circuits. One standard semiconductor wafer described in this invention is a silicon wafer 200 mm in diameter, 0.75 mm thick, with an approximate radius of curvature of about 0.15 millimeters (see SEMI Specification M1-0298). Of course, semiconductor wafers of other dimensions, such as standard 300 mm diameter silicon wafers, can also be processed in accordance with this invention. Note that standard specifications for a 300 mm diameter wafer may be found in SEMI Specification M1.15-0997.

"Deposition" refers to various processes that provide a thin layer of precursor on a substrate surface. The precursor layer adheres to the substrate surface by any of a number of mechanisms. In many cases, the precursor layer is simply adsorbed on the substrate surface. Given the physical properties of most organo-metallic precursors, chemical vapor deposition is a typical mechanism for delivering and depositing precursor as a thin layer on the substrate surface. Processes in which a monolayer of precursor molecules (or more generally a saturated layer of precursor molecules) is deposited on a substrate surface from the vapor form of the precursor are referred to as atomic layer chemical vapor deposition (ALCVD) processes.

Note that the invention is not limited to deposition of single monolayers in each precursor deposition cycle. Essentially any thickness of precursor molecule may be employed: monolayers, bilayers, trilayers, etc. In many cases, the amount of precursor deposited is simply the amount that adsorbs to the substrate surface under a particular set of conditions. The steady state quantity of precursor adsorbed under these conditions is referred to as a "saturated" layer. As explained below, certain temperatures and pressures support only a monolayer of adsorbed precursor. More frequently, the staturated layer contains slightly less or somewhat more than a monolayer.

Throughout this specification, two principal examples will be presented. The first involves forming a cobalt adhesion layer on a dielectric surface. The second involves forming a copper seed layer for subsequent electrofill. In both examples, the invention is employed to produce a thin metal layer on a semiconductor substrate surface. In the first example, a thin layer of cobalt is formed on a diffusion barrier layer or a dielectric layer. In the second example, a thin copper "seed" layer is formed on the cobalt layer or a diffusion barrier layer. This seed layer is typically deposited in preparation for a thicker electrofill layer. A particular semiconductor process that is compatible with the invention is Damascene processing, but the current invention is not limited to Damascene processing or semiconductor processing in general. The current invention is useful in many applications where a thin layer or layers of metal must be deposited.

Figure 1A:
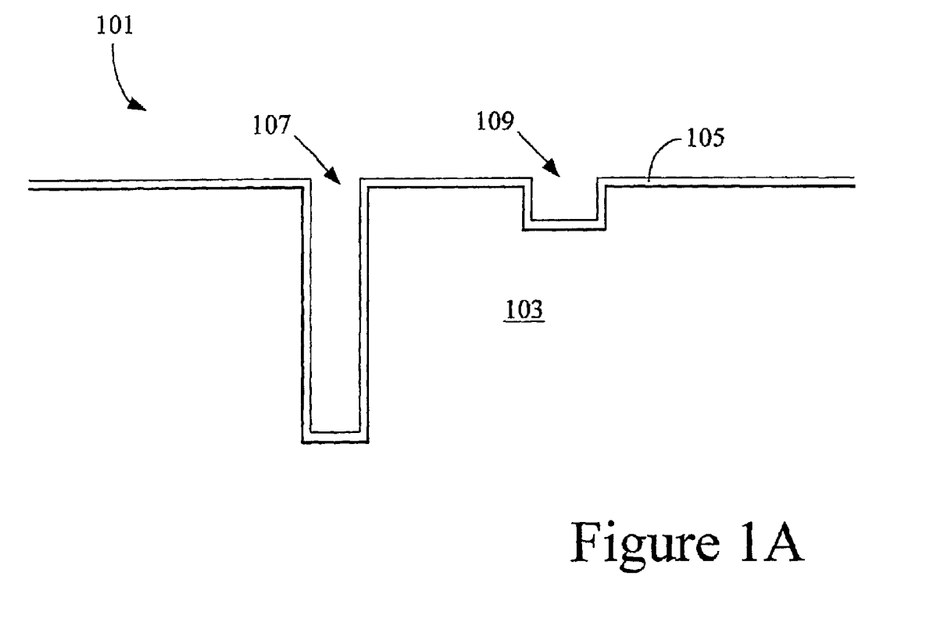
FIG. 1A is a schematic illustration of a semiconductor substrate, showing the dielectric substrate, barrier layer, and surface features.
Figure 1B:
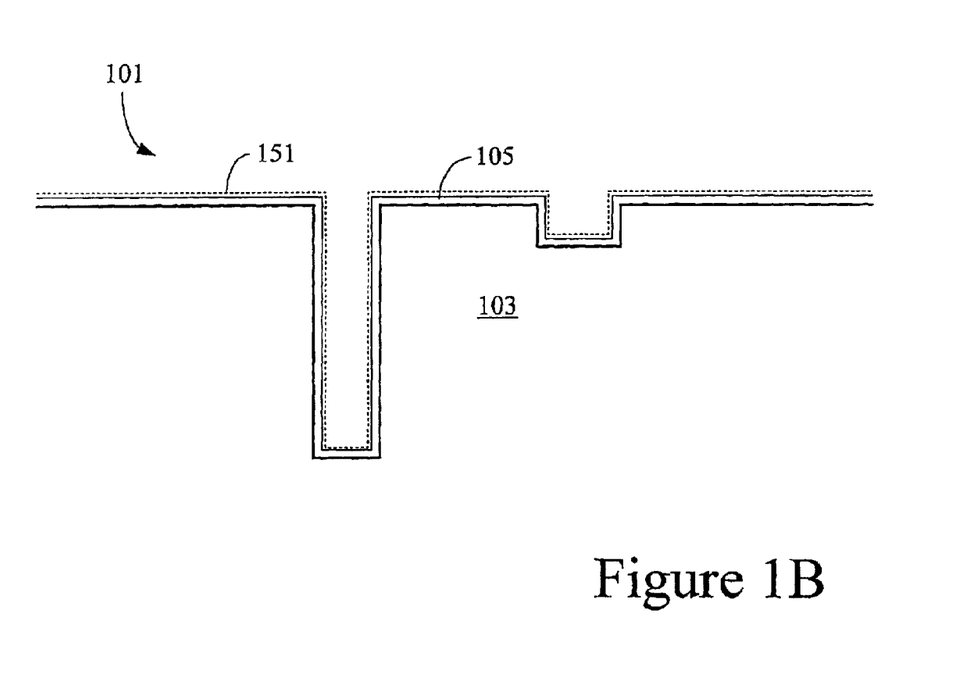
FIG. 1B shows the same semiconductor substrate as in FIG. 1A with the barrier layer covered by a saturated layer deposited by ALCVD.

FIG. 1A schematically illustrates a portion of a semiconductor wafer 101. The illustration shows an underlying substrate 103 (typically including silicon dioxide) and a barrier layer 105. The figure also illustrates two features of the semiconductor surface 107 and 109, the first having narrow widths and high-aspect ratios. PVD and CVD methods of the current art often cannot cover such high-aspect features in a conformal manner (step coverage), particularly when features 107 and 109 have deep submicron dimensions. The current invention, however, is able to deposit a conformal monolayer, illustrated as layer 151 of FIG. 1B.

Figure 2:
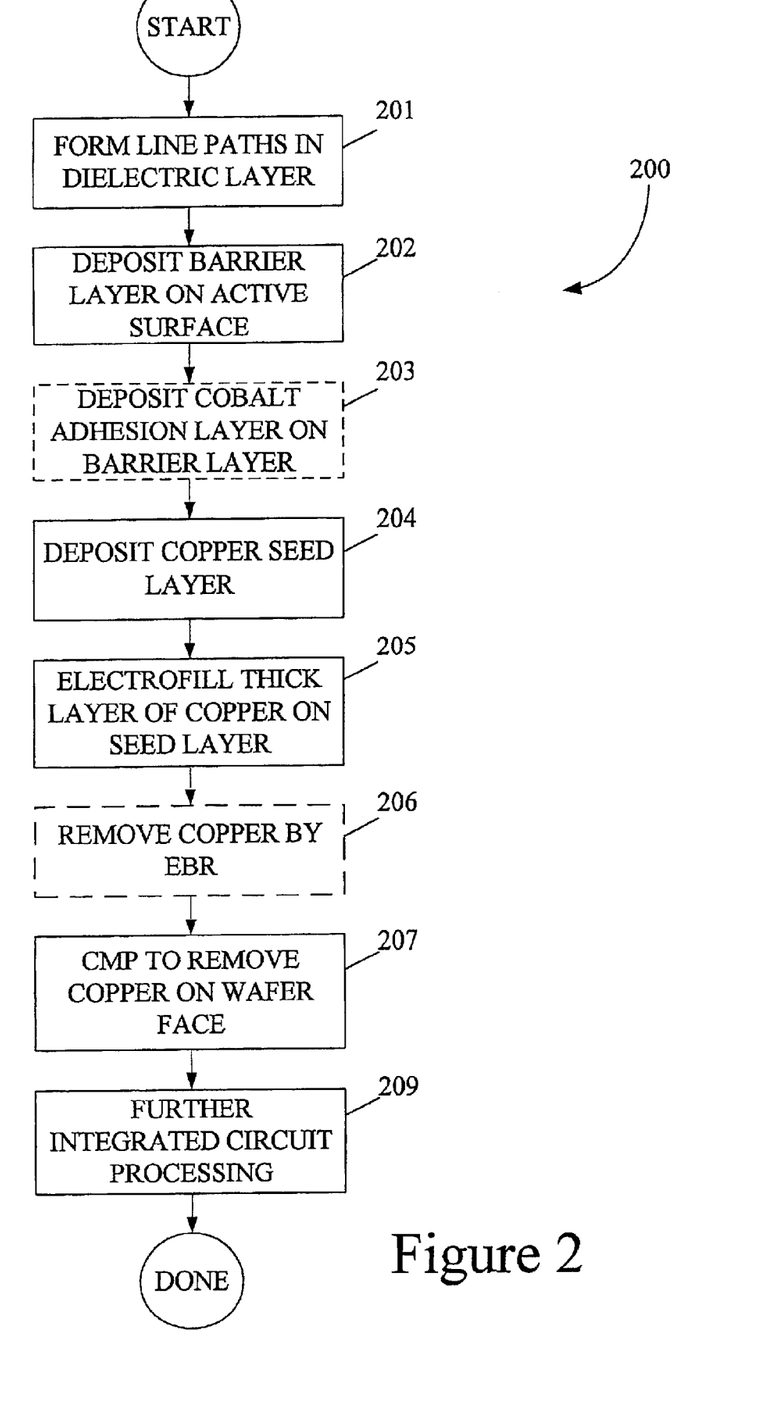
FIG. 2 is a process flow diagram illustrating relevant operations employed to form conductive copper lines by Damascene processing.

A typical Damascene process flow 200 in accordance with this invention is illustrated in the flowchart of FIG. 2 in order to contextualize the present invention. Process 200 begins with formation of line paths (201) in a previously formed dielectric layer. These line paths may be etched as trenches and/or vias in a blanket layer of dielectric such as silicon dioxide. The paths and vias may be etched in one or more dielectric layers in accordance with conventional Damascene and Dual Damascene processes, for example. The line paths define conductive routes between various devices on a semiconductor wafer.

Because copper or other mobile conductive material provides the conductive paths of the semiconductor wafer, the underlying dielectric layers must be protected from metal ions (e.g., $Cu^{+1}$) that might otherwise diffuse into the silicon. To accomplish this, the process includes depositing a thin diffusion barrier layer (202) before depositing the metal. Suitable materials for the diffusion barrier layer include titanium, tantalum (Ta), tantalum nitride (TaN), tantalum nitride silicon (TaNSi), tungsten (W), titanium (Ti), titanium tungsten (TiW), titanium nitride silicon (TiNSi) and the like. The barrier layer is often formed by a PVD process such as sputtering.

Before inlaying the line paths with the electrofill copper, a conductive surface coating must be applied. In the depicted process, this is accomplished by first depositing a cobalt adhesion layer at 203 (optional) and then depositing a copper seed layer on the adhesion layer or barrier layer (as the case may be) at 204. The cobalt layer may be formed by PVD, CVD, combinations thereof, etc. Preferably, the cobalt adhesion layer is formed by a CVD process in accordance with this invention. In other words, the cobalt layer is preferably formed by first depositing an organo-cobalt precursor, then oxidizing the precursor to form a cobalt oxide, and finally reducing the cobalt oxide to generate a layer of cobalt metal.

Preferably, the seed layer is deposited by copper ALCVD, as will be described in detail below. In some cases, copper ALCVD may be used in combination with other CVD or PVD processes to form the seed layer. The copper ALCVD operation is described in detail below. The wafer is then electrofilled at 205 with a thicker layer of copper over the seed layer, by electroplating using an electroplating solution. The copper is deposited to a thickness that completely fills the various line paths in the dielectric layer. If any of features of the semiconductor wafer have very small dimensions and high-aspect ratios, then the copper ALCVD and/or other seed layer process may in fact replace the electrofill step. For instance, a high-aspect via cut into the surface of the semiconductor wafer, if only a few atoms wide, can be filled by an atomic layering process of only a few atoms, because in such a case there is no real distinction between layering and filling.

After deposition of the copper, by whatever means, is completed, the copper is treated to remove excess copper by various processes. Optionally, excess copper on the edge bevel regions of the wafer is removed by an EBR etch as depicted at 206. Then, the wafer is planarized at 207 by chemical-mechanical polishing (CMP) for example down to the dielectric in preparation for further processing (illustrated at 209), generally the addition of subsequent dielectric and metallization layers.

Metal Layer Formation

As indicated the invention provides methods for forming thin conformal metal layers on substrate surfaces having small and high aspect ratio features. The thin layers are derived from precursor molecules conformally deposited on the substrate surface to a thickness of a monolayer or more, on up to many molecular layers. The final thickness of the metal layer depends on the thickness of the precursor layer as well as the number of precursor deposition/oxidation/reduction cycles. In some embodiments, the invention employs CVD to deposit monolayers of precursor for subsequent oxidation and reduction to produce monolayers or near monolayers of metal.

ALCVD is a process that has been in use since the 1970's. Atomic layer chemical vapor deposition, as its name implies, involves the deposition of a single atomic layer of material by a chemical vapor. Because of its very nature, ALCVD has generally been used in epitaxial applications, where small amounts of materials (often expensive or exotic) are deposited in low-throughput applications. ALCVD is used to coat small tools and jewelry, and to form crystalline structures.

Until recently, ALCVD has rarely been used or proposed to deposit conductive metal on integrated circuit wafers. One reason is because the metals that were typically used in integrated circuits (e.g., aluminum) tend to form oxides that are very stable and difficult to reduce back to the non-oxidized form. Note that CVD deposition of metals typically requires that the deposited organo-metallic precursors be oxidized, thereby removing the organic groups but producing metal oxides.

Unlike some other metal oxides, copper oxides are not particularly stable. Note that copper forms two oxides, cuprous ($Cu_2O$) and cupric oxide (CuO), and one metastable oxide, $Cu_4O_3$, that can be thought of as a combination of cuprous and cupric oxide, where one unit cell of $Cu_4O_3$ is a stoichiometric combination of $Cu_2O$ and CuO. Cobalt oxides (II and III valence oxides) are similarly unstable. Hence ALCVD and other CVD processes are viable processes for use in forming thin conformal cobalt or copper layers. CVD can similarly be used in processes for forming layers of other metals such as rhodium, irridium, and ruthenium.

ALCVD processes for forming layers of these metals have various benefits. First, ALCVD provides extremely conformal, uniform coverage even with high-aspect ratio circuit features. In addition, it can be practiced at relatively low temperatures and short times, thus consuming relatively little of the thermal budget for a given fabrication process. Note that all process operations to deposit metal layers in accordance with the invention occur at low temperature, so the process is compatible with temperature-sensitive low-delectric constant polymers. Further, the effectiveness of ALCVD in the context of this invention allows for the use of apparatus and procedures that are simpler and less expensive than those used with PVD and CVD processes of the current art.

ALCVD operates by saturating the surface with a single monolayer of chemical species. At certain temperatures, only a monolayer of chemical species will adhere to the substrate surface. Because it operates in a saturation regime, the process is flow and pressure insensitive. This allows a simpler and cheaper design of the hardware. This saturation regime is also relatively temperature insensitive, allowing a range of temperatures typically spanning about 25 degrees centigrade, so the temperature control requirements can be eased, thus allowing for a simpler and cheaper temperature control system. An apparatus module that is used for ALCVD in one application can also be adapted to deposit layers of different thickness in different applications, and even to deposit different materials.

Further, by limiting the deposition to only one self-limiting monolayer in a deposition cycle, the problem of trapping carbon below the surface is avoided. The oxidizing species reacts with the organic moieties on the precursor and removes them prior to deposition of additional metal.

Figure 3:
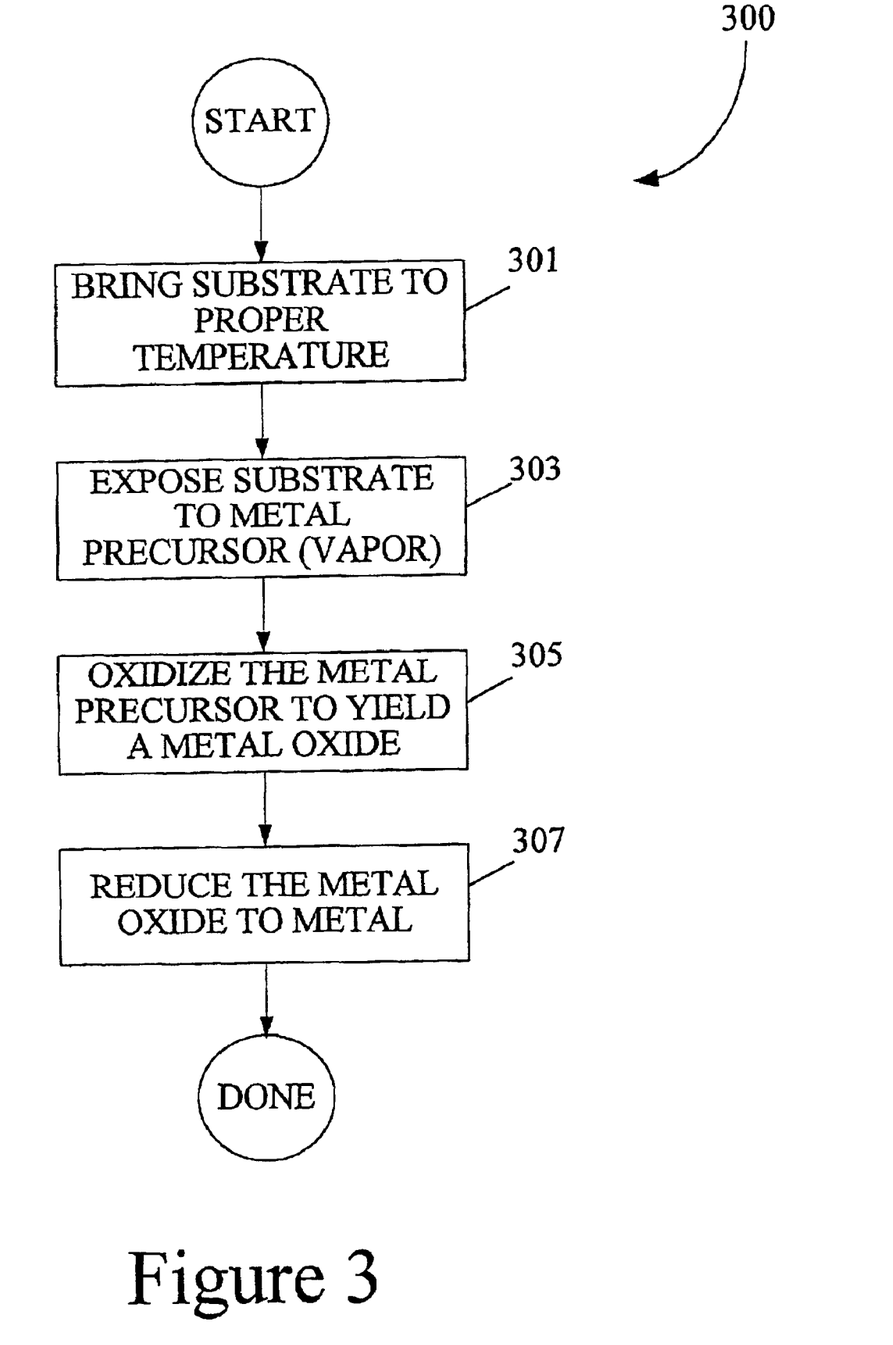
FIG. 3 is process flow diagram illustrating relevant operations employed to perform metal layer formation in the context of the present invention.

FIG. 3 is a high-level flowchart illustrating a preferred process 300 for employing CVD (preferably ALCVD) to form thin metal layers. The same apparatus module, an example of which is described in below in FIG. 6, may be used to carry out the ALCVD and some or all of the other operations, such as oxidation and reduction. The apparatus module may even be employed to carry out barrier layer deposition and additional seed layer operations of an IC manufacturing process, as described above. Alternatively, the ALCVD process may also be carried out in a separate module of its own. In that case, the substrate must be transported between various reactor modules, such as by a wafer handling robot in a cluster tool.

Figure 4:
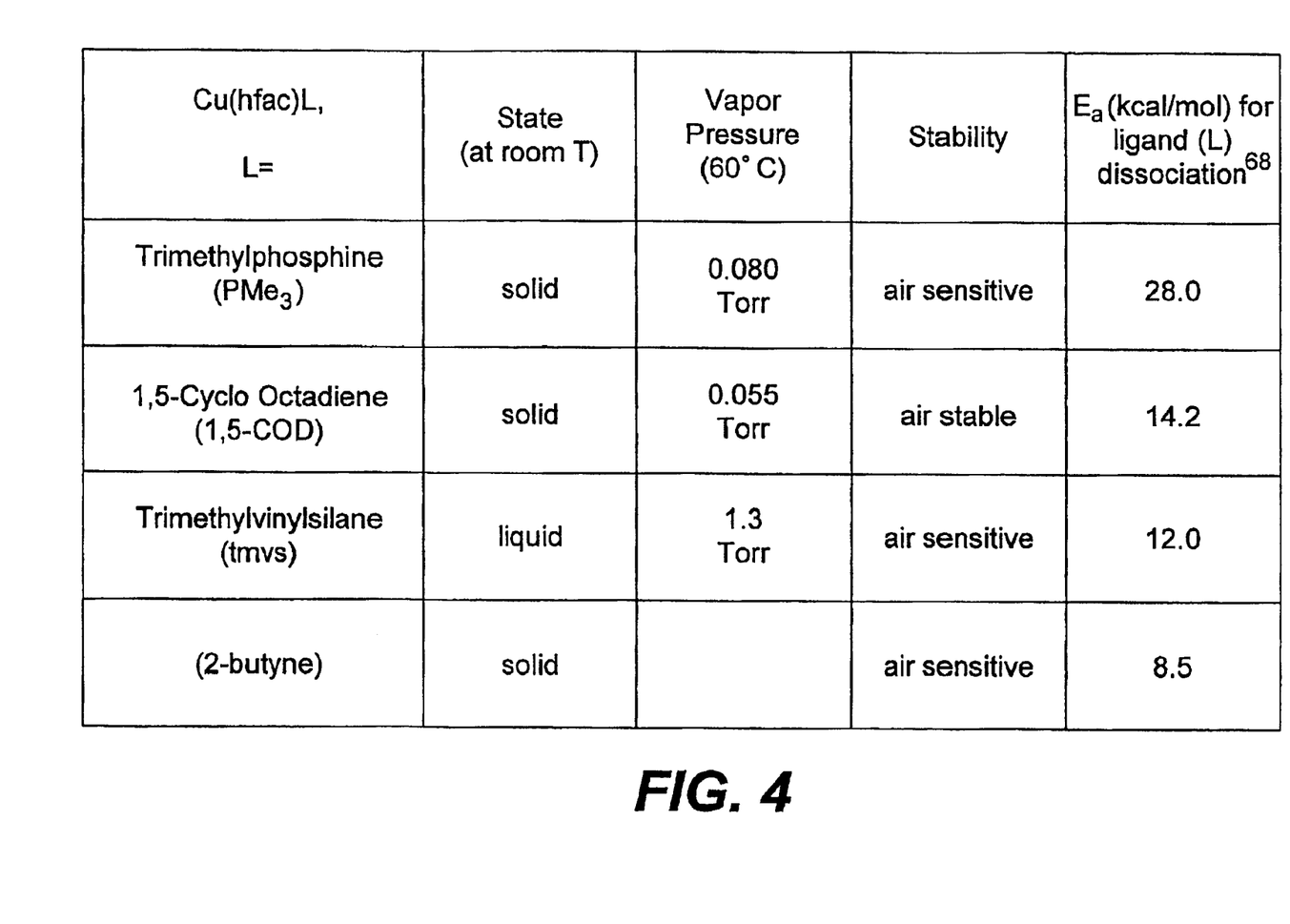
FIG. 4 is a table listing various copper precursors and their properties.

Turning now to the process flow, at 301 the semiconductor wafer is stabilized at a proper temperature for precursor deposition, typically 50–200° C. for ALCVD of many copper and cobalt precursors. Next, the wafer is exposed to a high-vapor pressure, metal precursor at 303. For copper, these precursors typically have the form CuXL, where the copper is bonded to a Lewis acid (X) and a stabilizing ligand (L). Examples of such copper precursors with ligands include $Cu^I(hfac)(tmvs)$, $Cu^I(hfac)(1,5COD)$, $Cu_I(hfac)$ (Pme3), $Cu^I(hfac)(2\text{-butyne})$ and $Cu^I(thd)_2$, each of which have the Lewis acid hexafluoro-acetylacetonate (hfac). The preferred precursor is $Cu^I(hfac)(tmvs)$, which is sold under the brand name CupraSelect™ and is available from Air Products, Inc., of Allentown, Pa. $Cu^I(hfac)(tmvs)$ has a high vapor pressure and is liquid at room temperature, which makes it easy to store and handle. FIG. 4 lists these copper precursors, along with the full chemical names of their ligands, vapor pressures at 60° C., and activation energies for ligand dissociation.

For $Cu^I(hfac)(tmvs)$, the semiconductor substrate is preferably stabilized at a temperature of between about 60 and 100° C. Before the substrate reaches this temperature, it is held in vacuum or inert atmosphere. It takes approximately $10^{-6}$ torr/second (one second at $10^{-6}$ torr) for a monolayer of atoms or molecules to strike an exposed substrate (in surface chemistry, this unit of measure is known as a Langmuir). Since not all of the atoms that strike the surface will adhere to it, the actual number of atoms that adhere to the surface will depend on an adhesion coefficient for the surface at the given temperature. In the case of the current invention, the deposition may be preferably carried out at a precursor partial pressure of 10–15 mtorr for 1 to 1000 seconds. The deposition can be. carried out at a low total pressure, or more preferably, at atmospheric or near atmospheric pressure with a neutral gas such as argon to make up the remaining pressure (beyond the 10–15 mtorr partial pressure of the precursor). The use of atmospheric or near atmospheric pressure is preferred, since this obviates the need for expensive vacuum pumping.

As indicated, the invention is not limited to copper layer formation. It also pertains to certain cobalt; ruthenium, indium, and rhodium metal layers for example. Each of these metals has its own set of acceptable precursors. Examples of suitable organo-cobalt precursor molecules include cobalt carbonyl $(Co_2(CO)_6)$, cobaltocene $(Co(C_5H_5)_2)$, cyclopentadienyl cobalt dicarbonyl $(C_5H_5Co(CO)_2)$, cobalt acetylacetonate $(Co(C_5H_7O_2)_3)$, cobalt tricarbonyl nitrosyl $(Co(CO)_3NO)$, and combinations thereof. Examples of suitable organo-ruthenium precursors include ruthenocene (bis(cyclopentadienyl)ruthenium; $(C_5H_5)_2Ru$), $Ru(acac)_3(Ru(CH_3COCHCOCH_3)_3)$, $Ru(TMHD)_3$ (Ruthenium 2,2,6,6-tetramethyl-3,5-hepanedionato; $Ru((CH_3)_3CCOCHCOC(CH_3)_3)_3)$, and other beta-dikenonate containing complexes. Examples of suitable organo-iridium precursors include any beta-diketonate containing complex, such as $Ir(acac)_3$, and (methylcyclopentadiene)(1,5-cyclooctadiene)Ir(I). Examples of suitable organo-rhodium precursors include any beta-diketonate containing complex such as dicarbonylacetylacetonato rhodium(I).

Generally, the precursor chosen should be stable at its storage temperature and at least moderately stable at the deposition temperature. But the compound may for example dissociatively adsorb on the substrate surface at the temperature of interest. Further the vapor pressure should be sufficiently high to allow easy delivery in the vapor phase. For ALCVD, the vapor pressure should be sufficiently high that multilayer deposition does not occur at the deposition temperature.

Returning to the process of FIG. 3, after deposition, an adsorbed layer of precursor (e.g., a self-limiting monolayer in the case of ALCVD conditions) resides on the substrate surface. At this point, the precursor source is typically shut off from the process chamber and process chamber is evacuated. A thin adsorbed layer of precursor remains.

Now the layer is exposed to an oxidizing environment to liberate the ligand or otherwise remove the organic moieties from the precursor by oxidizing the precursor. See 305. This can be accomplished with a flux of atomic oxygen or other highly reactive oxidizing species. It can be done rapidly and efficiently by an atomic oxygen plasma discharge, for example. In a specific example, molecular oxygen is introduced into a plasma reactor to generate the oxygen plasma Other oxidizing ambients or gas admixtures could also be used, e.g., NO, $O_2/He$, $O_2/air$, ozone, hydrogen peroxide, and the like. The plasma exposure is carried out for a sufficient time to remove all carbonaceous material. The gaseous byproducts are pumped away. In some embodiments, the oxidizing agent may also be water vapor. It is apparent to one of skill in the art to use appropriate process conditions for exposing the precursor to water vapor in order to liberate the ligand. Regardless of what type of oxidizing environment is employed, the end product is a thin layer of metal oxide (e.g., copper or cobalt oxide). Note that the oxide formed at 305 should be non-volatile at the oxidation temperature.

Next, a reducing atmosphere, typically in the form of molecular hydrogen plasma, is exposed to the oxide to reduce it to the metal. See 307. In one embodiment, the metal oxide on the substrate is exposed to a flux of reactive atomic hydrogen or other highly reactive reducing species such as excited molecular $H_2^*$. An RF plasma is typically used to generate reactive hydrogen. Actual exposure time is unimportant as long as it is of sufficient duration to reduce at least a surface layer of the oxides that were formed in the previous operation. In some embodiments, only a portion of the oxide is reduced to metal. The underlying oxide remains unreduced as oxide (on the unexposed side of the metal). For certain applications such as formation of a ruthenium oxide-ruthenium bilayer ($RuO_2/Ru$), this may be desirable.

In an alternative embodiment, the atomic layer of precursor can be exposed to an oxidizing agent that liberates the ligand without oxidizing the metal to a metal oxide.

The above procedure (301 through 307) may be repeated until the desired thickness of metal (e.g., cobalt or copper) has been reached. For many applications, this will be 5–50 angstroms (1–10 monolayers). This includes cobalt adhesion layers and copper seed layers. The number of cycles required to produce a given thickness depends on how much precursor is absorbed in 303. If only a monolayer is absorbed, then the maximum number of cycles will be required.

In one embodiment, a monolayer of copper formed by this process can be used as the seed layer for the electrofill described in 204. More typically, however, the actual seed layer will be somewhat thicker. Additional thickness can be provided using PVD or conventional CVD on top of the copper ALCVD layer, which serves as a conformal primer for the seed layer. As indicated, a series of copper ALCVD layers can be employed to thicken this primer, or even to complete the entire seed layer. Repeating the ALCVD too many times may reduce the IC manufacturing throughput to an undesirable. level, however, since by its very nature ALCVD can only deposit one atomic layer at a time. When the seed layer is complete, regardless of how it is prepared, the semiconductor wafer is then ready for the electrofill process, 204.

Figure 5:
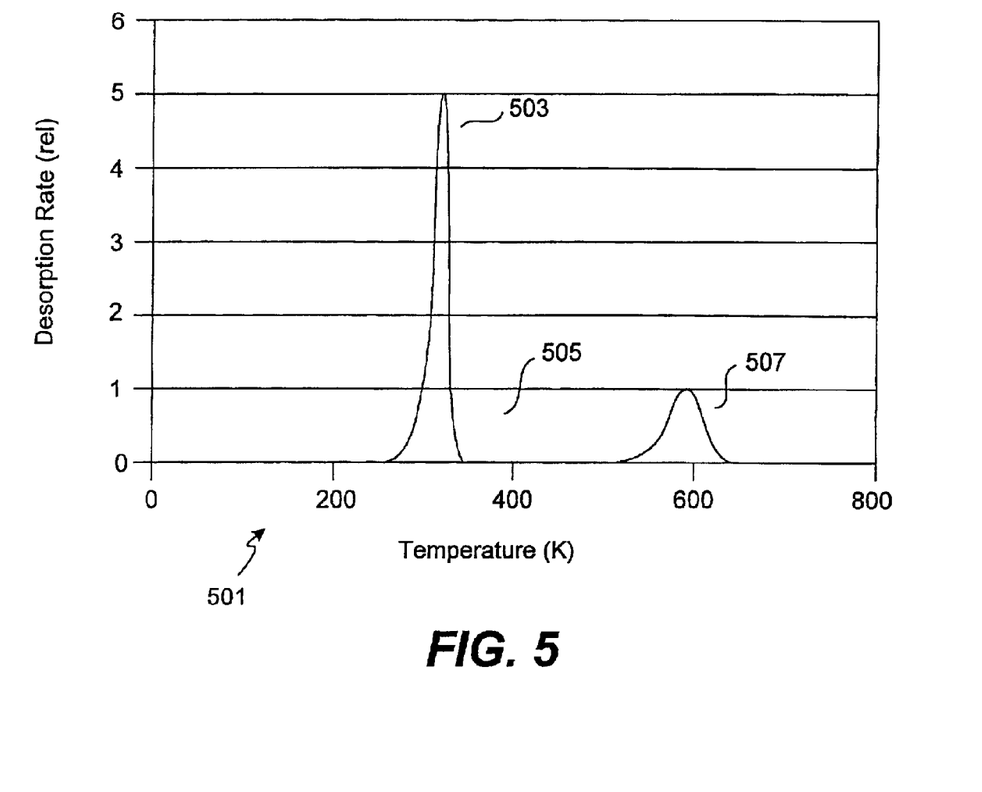
FIG. 5 is a generic temperature desorption spectroscopy graph illustrating the different temperatures for energy of chemibsorption and energy of condensation.

ALCVD relies on the fact that the energy of condensation on a homogenous surface is generally lower than the energy of chemisorption between two heterogeneous surfaces. For example, consider a substrate surface (i.e., a semiconductor wafer with a barrier layer) at a low temperature which is covered with several layers of a molecule such as $Cu^I(hfac)$ L. If we raise the temperature, at a certain point, the upper layers of the molecules will begin to desorb from the substrate. This is illustrated in a generic temperature desorption spectroscopy graph, 501 of FIG. 5, where the large, low temperature peak 503, represents the upper layers desorbing from the substrate. Next, typically, there is a temperature range where no desorption occurs. See 505. This is because the upper layers, with the lower, energy of condensation, have been desorbed, but the temperature is not sufficiently high to desorb the last layer. Desorption of the monolayer is represented by the smaller, higher temperature peak, 507.

If the copper deposition is carried out in this temperature range, represented in the generic plot as peak 507, then a single saturated layer, and only a single layer, will deposit on the substrate. This temperature will vary based on the nature of the substrate and depositing molecule. For deposition of a copper precursor on a typical barrier layer used in IC manufacturing such as tantalum, this temperature is typically between about 150 and 300° C. Those of skill in the art will understand how to determine the temperature for monolayer absorption of a given substrate and precursor. In one example, one generates a plot as described in FIG. 5. A further discussion of the concepts of ALCVD can be found in S. M. George, et. al., "Surface Chemistry for Atomic Layer Growth," *J. Phys Chem*, 1996, 100(31) (13121–13131), which is herein incorporated by reference in its entirety for all purposes.

Figure 6:
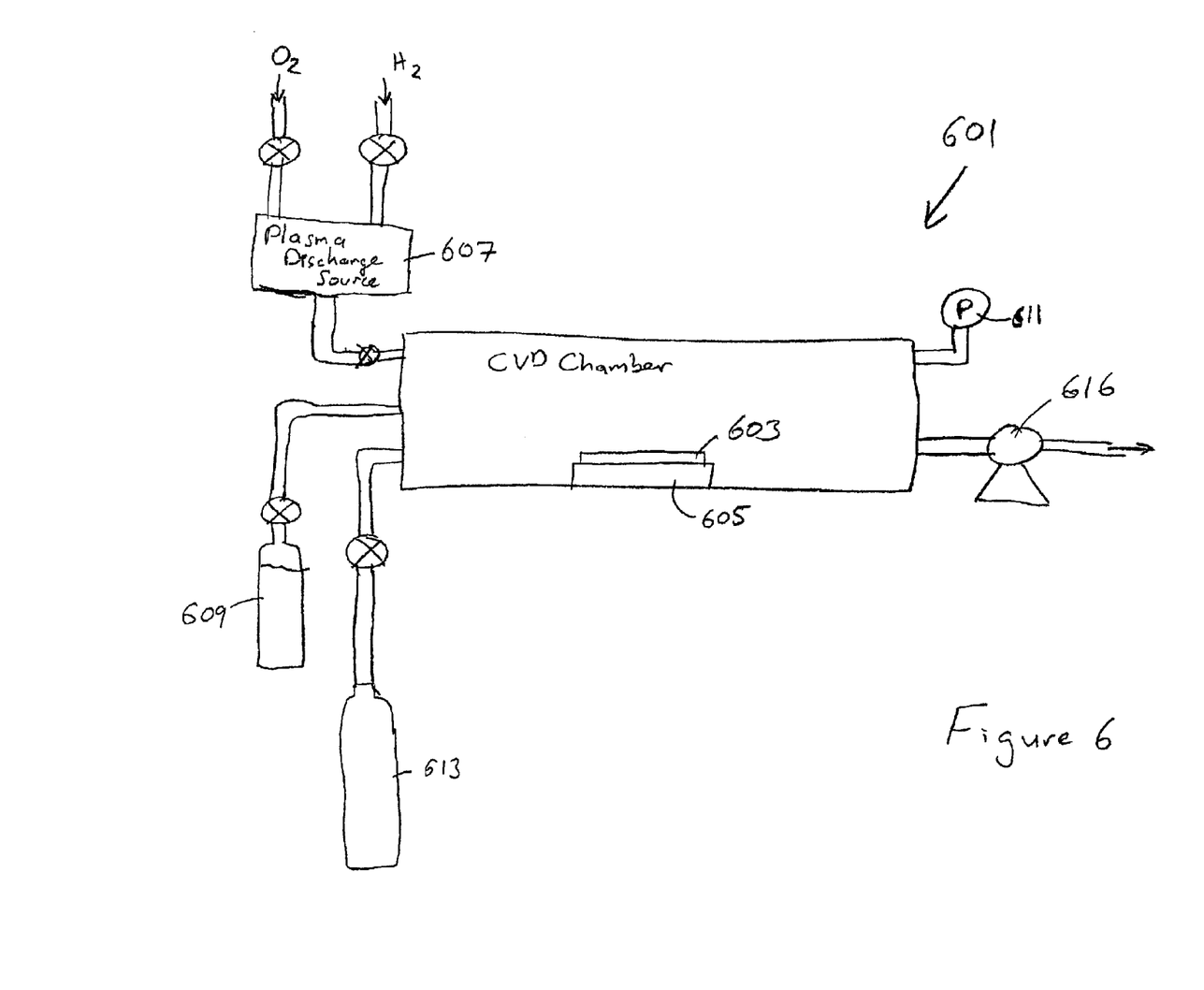
FIG. 6 is a block diagram illustrating an ALCVD apparatus used to practice the current invention.

FIG. 6 depicts a system 601, in which the invention may be practiced. Inside the apparatus chamber, the semiconductor wafer 603, sits on top of a supporting pedestal 605. The supporting pedestal 605 has a thermocouple or other temperature sensing mechanism attached to it to precisely monitor the temperature of the wafer. The wafer can be heated by any number of commonly-known methods, such a wire coil. The apparatus includes a plasma discharge source, 607, which is used to introduce the oxygen and hydrogen plasma at the appropriate points during the process. A copper or cobalt precursor source 609, typically stores the precursor as a liquid. The system also includes a pressure gauge 611, to monitor the pressure within the chamber, a neutral gas source (e.g., argon) 613 and a pump 616. The system can also include a water source that can be used to expose the atomic layer of precursor to water vapor, rather than oxygen, as the oxidizing agent. The water vapor may liberate the ligand without oxidizing the copper or cobalt, thus obviating the need for a separate reduction operation.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of forming a metal layer on a workpiece, the method comprising
   (a) depositing a layer of organo-metallic precursor on a surface of the workpiece;
   (b) oxidizing the organo-metallic precursor to form a metal oxide layer on the surface; and
   (c) reducing at least a portion of the metal oxide layer to form the metal layer on the workpiece.

2. The method of claim 1, wherein (a) is performed on an exposed layer of diffusion barrier on the workpiece, an exposed adhesion layer on the workpiece, or an exposed dielectric layer on the workpiece.

3. The method of claim 1 wherein the workpiece is a partially fabricated integrated circuit having one or more gaps, and wherein the surface of the partially fabricated integrated circuit surface comprises features having an aspect ratio of at least about 5:1.

4. The method of claim 3 wherein the features have a principal dimension at most about 0.26 μm.

5. The method of claim 3, further comprising electrodepositing a bulk layer of metal on the partially fabricated integrated circuit to thereby fill the gaps with the metal.

6. The method of claim 5, wherein the bulk layer of metal forms conductive lines on the integrated circuit.

7. The method of claim 3 further comprising depositing a second metal layer on the metal layer, wherein the metal layer helps the second metal layer to adhere to the surface of the partially fabricated integrated circuit.

8. The method of claim 1, wherein the metal is copper, cobalt, ruthenium, rhodium, indium, or a combination thereof.

9. The method of claim 1, wherein the organo-metallic precursor comprises an organo-copper compound, an organo-cobalt compound, an organo-ruthenium compound, an organo-iridium compound, an organo-rhodium compound, or a combination thereof.

10. The method of claim 1, wherein (a) comprises absorbing a layer of the organo-metallic precursor the surface of the workpiece.

11. The method of claim 1, wherein (a) comprises forming a saturated layer of the organo-metallic precursor on the surface of the workpiece.

12. The method of claim 1, wherein (a) comprises depositing a layer of the organo-metallic precursor on the surface of the workpiece by atomic layer chemical vapor deposition.

13. The method of claim 1, wherein (b) comprises oxidizing the organo-metallic precursor layer with an oxygen plasma or an oxygen-containing plasma.

14. The method of claim 1, wherein (c) comprises reducing the metal oxide layer with a hydrogen plasma or a hydrogen-containing plasma.

15. A method of depositing a thin layer of cobalt metal on a substrate surface, the method comprising
   (a) depositing a layer of organo-cobalt precursor on a surface of the substrate;

(b) oxidizing the organo-cobalt precursor to form a cobalt oxide layer on the surface; and (c) reducing at least a portion of the cobalt oxide layer to form the cobalt layer on the substrate surface.

16. The method of claim 15, wherein the substrate is a partially fabricated integrated circuit.

17. The method of claim 15, wherein (a) is performed on an exposed layer of diffusion barrier on the substrate surface.

18. The method of claim 15, wherein the organo-cobalt precursor comprises cobalt carbonyl ($Co_2(CO)_6$), cobaltocene ($Co(C_5H_5)_2$), cyclopentadienyl cobalt dicarbonyl ($C_5H_5Co(CO)_2$), cobalt acetylacetonate ($Co(C_5H_7O_2)_3$), cobalt tricarbonyl nitrosyl ($Co(CO)_3NO$) or a combination thereof.

19. The method of claim 15, wherein (a) comprises absorbing a layer of the organo-cobalt precursor the substrate surface.

20. The method of claim 15, wherein (a) comprises forming a saturated layer of the organo-cobalt precursor on the substrate surface.

21. The method of claim 15, wherein (a) comprises depositing a layer of the organo-cobalt precursor on the substrate surface by atomic layer chemical vapor deposition.

22. The method of claim 15, wherein (b) comprises oxidizing the organo-cobalt precursor layer with an oxygen plasma or an oxygen-containing plasma.

23. The method of claim 15, wherein (c) comprises reducing the cobalt oxide layer with a hydrogen plasma or a hydrogen-containing plasma.

24. The method of claim 15, further comprising depositing a seed layer of copper on the cobalt layer.

25. The method of claim 24, further comprising electro-depositing a bulk layer of copper on the substrate to thereby fill gaps on the substrate surface with copper.

26. The method of claim 25, wherein the bulk layer of copper forms conductive lines on an integrated circuit.

* * * * *